United States Patent [19]

Ito et al.

[11] Patent Number: 4,699,801

[45] Date of Patent: Oct. 13, 1987

[54] SEMICONDUCTOR DEVICE

[75] Inventors: Hitoshi Ito, Mitaka; Takahiko Moriya, Yokosuka, both of Japan

[73] Assignee: Kabuskiki Kaisha Toshiba, Kawasaki, Japan

[21] Appl. No.: 832,875

[22] Filed: Feb. 26, 1986

[30] Foreign Application Priority Data

Feb. 28, 1985 [JP] Japan .................................. 60-39425
Feb. 28, 1985 [JP] Japan .................................. 60-39427

[51] Int. Cl.⁴ ............................................. B05D 3/06
[52] U.S. Cl. .................................... 427/53.1; 427/55; 427/248.1; 437/235; 437/245
[58] Field of Search .................... 427/53.1, 55, 82, 86, 427/88, 91, 248.1; 156/643

[56] References Cited

U.S. PATENT DOCUMENTS

| 3,697,342 | 10/1972 | Cuomo | 427/86 |
| 4,340,617 | 7/1982 | Deutsch | 118/50.1 |
| 4,359,486 | 11/1982 | Patalong | 427/88 |
| 4,371,587 | 2/1983 | Peters | 427/54.1 |
| 4,448,801 | 5/1984 | Fukuda | 427/55 |
| 4,495,218 | 1/1985 | Azuma | 427/54.1 |
| 4,496,609 | 1/1985 | McNeilly | 427/88 |
| 4,517,225 | 5/1985 | Broadbent | 427/91 |
| 4,552,783 | 11/1985 | Stoll | 427/91 |

OTHER PUBLICATIONS

W. T. Stacy, E. K. Broadbent and M. H. Norcott, J. Electrochem. Soc., vol. 132, No. 2, pp. 444–448 (1985), "Interfacial Structure of Tungsten Layers Formed by Selective Low Pressure Chemical Vapor Deposition".
E. K. Broadbent, C. L. Ramiller, J. Electrochem. Soc., vol. 131, No. 6, pp. 1427–1433 (1984), "Selective Low Pressure Chemical Vapor Deposition of Tungsten".
R. W. Andreatta, C. C. Abele, J. F. Osmundsen, J. G. Eden, D. Lubben and J. E. Greene "Low-Temperature Growth of Polycrystalline Si and Ge Films by Ultra Violet Laser Photo Dissociation of Silane and Germane", Appl. Phys. Lett., vol. 40, No. 2, 15 Jan. 1982, pp. 183–185.

Primary Examiner—John D. Smith
Assistant Examiner—Vi Duong Dang
Attorney, Agent, or Firm—Finnegan, Henderson, Farabow, Garrett & Dunner

[57] ABSTRACT

A semiconductor device is produced in such a manner that light having a wavelength in a range of 400 to 1000 nm is irradiated on a substrate so as to excite bonding hand of a material gas into a vibrating condition, and a thin film is formed on the substrate in accordance with a chemical vapor deposition method.

8 Claims, 14 Drawing Figures

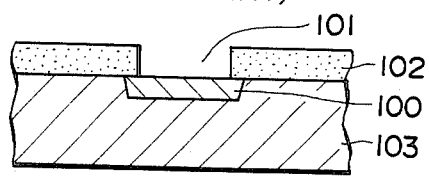
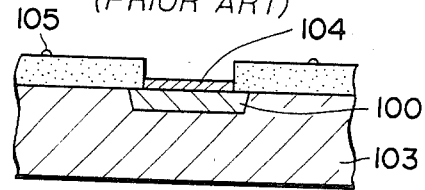
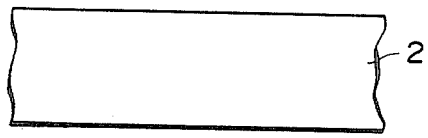
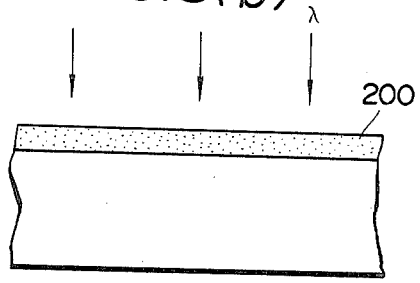
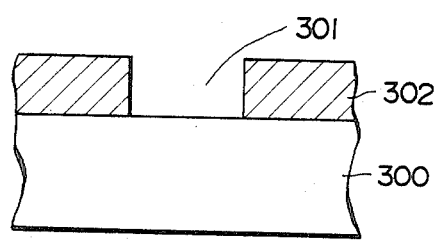
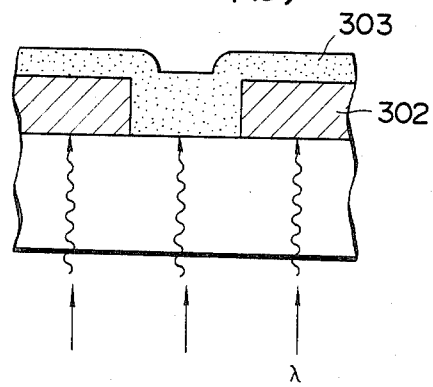
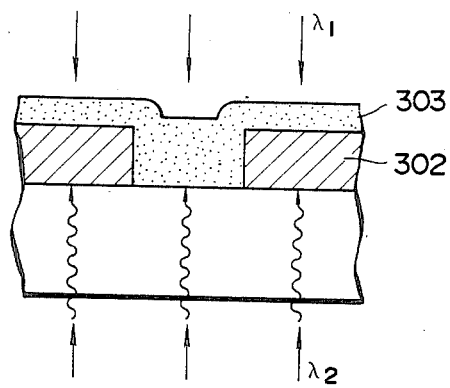

SEMICONDUCTOR DEVICE

BACKGROUND OF THE INVENTION

1. Field of the Invention

This invention relates to a semiconductor device producing method, and more particularly to a thin film producing method using a chemical vapor deposition method utilizing light.

With the progress of semiconductor technologies, integration of semiconductor devices to get higher degree, as in the case of very large scale integrated circuit (LSI), is constantly sought for. Since the integration of higher degree can be realized by minimizing the circuit components, pattern forming technique of high precision and thin-film forming technique of high quality are urgently required.

A chemical vapor deposition method (CVD method) is well known in the art of forming thin film. According to this method, one or more compounds and/or a simple substance of 1n element forming the thin film is supplied in a gas state onto a substrate so as to grow a thin film of the element on the substrate, as a result of a chemical reaction. The CVD method can be further classified into an ordinary pressure CVD method, reduced pressure CVD method, plasma CVD method and the like. Since the ordinary pressure CVD method deposits a thin film under an ordinary pressure (760 Torr), the deposition speed thereof is high. However, a gas-phase reaction tends to occur during the deposition, and since it is difficult to heat the reaction chamber entirely, means for heating the substrate directly and evenly must be provided in the chamber. As a consequence, it is difficult to accommodate a large number of substrates in the chamber, thus lowering the productivity. Furthermore, the depositing temperature is difficult to control, and evenness of the thin film thereby obtained cannot be satisfactory. On the other hand, the reduced pressure CVD method deposits the thin film under a pressure of less than one Torr, and hence the depositing speed thereof is lower than that of the ordinary pressure CVD method. However, a large number of substrates can be accommodated in the chamber, so that the productivity of the reduced pressure CVD method is high.

Each of the above described methods utilizes a high-temperature heat energy for the reaction for the formation of the thin film. For instance, in a case of forming a polycrystalline silicon film by thermal decomposition of silane, a temperature of 600°–800° C. is utilized, and in a case where a thin film of silicon dioxide is formed by the thermal decomposition of tetraethyl-orthosilicate (TEOS, $SiO_4C_8H_2O$), a temperature of 650°–800° C. is used. For this reason, the thin film produced by these methods is restricted in its application in spite of the advantageous features they have. For instance, the silicon dioxide film formed by the TEOS thermal decomposition cannot be used for interlayer insulation film to be used for multilayer wiring using aluminum.

On the other hand, the plasma CVD method is a method wherein an electric energy is imparted, under a reduced pressure, to a reactive gas so as to provide plasma of chemically active molecules, atoms, ions, radicals and the like, and the chemical reaction of the gas is thereby promoted to accelerate formation of the thin film at a low temperature. However, when a silicon nitride ($Si_3N_4$) film is produced by the plasma CVD method from a mixed gas of silane ($SiH_4$)+nitrogen ($N_2$), the compositions of the silicon (Si) and the nitrogen (N) tend to be deviated from the stoichiometrical values thus entailing disadvantages such as damaging the under layer by hydrogen radicals and deteriorating the film by seized hydrogen and thermal deformation.

For obviating the above problems, so-called photo CVD method which utilizes light energy to the formation of the thin film has been developed recently and is now studied intensely. According to one example of this method, the substrate is locally heated by use of a laser light of 10.6 μm wave-length produced from, for instance, a CW carbon dioxide gas laser ($CO_2$ laser) of 50 W output, and a polycrystalline silicon film is formed on the substrate out of a material gas made of silicon-tetrachloride ($SiCl_4$). Alternatively, a polycrystalline silicon film is formed on a substrate by way of light decomposition caused by an excimer laser using argon fluoride (ArF), krypon fluoride (KrF) and the like. Since these examples utilize a laser of large output as a spot light source, productivity thereof is not sufficient, and hence are not utilized practically.

In another example of the method, utilizing light energy, a light sensitization reaction is effected in a reactive gas containing a trace of mercury (Hg) by use of a low or high pressure type mercury lamp, thereby providing a film of silicon dioxide ($SiO_2$) or silicon nitride ($Si_2N_4$). In this case, added mercury (Hg) absorbs light of 2537 Å wavelength emitted from the mercury lamp, and is brought into an excited condition of $Hg^*$ ($3P_1$). Upon bombarding with the reactive gas, the absorbed energy is transferred, and the chemical reaction is thereby maintained. In this case, there is a problem that the heavy metal mercury becomes contained in the film.

As is apparent from the above description, the conventional photo CVD method utilizes high light energy of a short wavelength ($\lambda < 350$ nm) to perform light decomposition of a material gas or a large output light source of long wavelength to heat substrate.

Furthermore, a method for forming a refractory metal film of tungsten (W), molybdenum by reducing halogen compounds of refractory metals such as tungsten (W), molybdenum (Mo) and the like by use of hydrogen or silicon exhibits a strong under-layer dependency enabling to form the refractory metal film selectively on the silicon surface of a substrate having, for instance, silicon and silicon dioxide in a mixed manner on its surface, and hence is widely known as a selective CVD method.

More specifically, as shown in FIG. 1(a), when a chemical vapor deposition process is applied to a P type silicon substrate 103, on which are formed an operative region made of, for instance, $N^+$ silicon diffusing layer 100 and a silicon dioxide film 102 having a contact hole 101, while using tungsten hexafluoride ($WF_6$) as a reactive gas and hydrogen gas as a carrier gas (or a reduction agent), the tungsten hexafluoride is reduced in accordance with the following formulas (1) and (2), and a tungsten film 104 can be formed selectively on the silicon surface of the substrate as shown in FIG. 1(b).

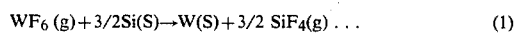

$$WF_6\,(g)+3/2Si(S)\rightarrow W(S)+3/2\;SiF_4(g)\ldots \quad (1)$$

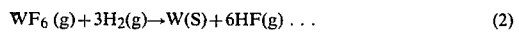

$$WF_6\,(g)+3H_2(g)\rightarrow W(S)+6HF(g)\ldots \quad (2)$$

where g designates gas phase, and S designates solid phase.

The above described technique is attempted to be applied to various fields such as (1) formation of intermediate layers at the time of providing electrodes in source-drain-gate regions for reducing the resistance of electrodes;
(2) formation of barrier metal layers in contact holes for preventing the occurrence of boundary surface reactions between the semiconductor regions and the electrode layers; and
(3) flattening the contact hole and through hole by way of deposition prior to the formation of the connection (wiring) layer for preventing disconnection of the connecting layer at stepped portions formed on the contact hole and through hole.

However, the technique has exhibited following problems.

An erosion phenomenon of silicon substrate tends to occur because of the chemical reaction of formula (1). This phenomenon essentially takes place in an isotropic manner so that the N+ silicon diffusion layer is eroded laterally and depthwisely at the same rate. However, the boundary layer between silicon and silicon dioxide is ordinarily more easily eroded, and in an extreme case, short circuiting between the electrodes and leakage due to a junction break-down tends to occur. Thus it has been required to control the reaction more precisely at the time of (1) formation of the intermediate layer and (2) formation of the barrier metal layer as miniaturization of the elements proceeds.

Furthermore, at the time of (3) flattening the contact hole and through hole by deposition, when the tungsten layer is made thick, tungsten grains 105 are deposited on the silicon dioxide layer, and the selectivity of the deposition is thereby impaired. In this case also, it is found that a precision control of the chemical reaction is required, and a process for removing the tungsten grains has been required additionally.

SUMMARY OF THE INVENTION

An object of the invention is to provide a method for producing a semiconductor device capable of forming a thin film of satisfactory properties at a low temperature.

Another object of the invention is to provide a method for producing a semiconductor device, wherein the selectivity of the formation of a refractory metal layer in accordance with the selective CVD method is substantially improved.

These objects can be achieved by a method for producing a semiconductor device wherein when a thin film is formed on a substrate in accordance with a chemical vapor deposition method, the substrate is irradiated by light having a wavelength falling in a range of 400 to 1000 nm.

By irradiating the substrate by light of the aforementioned wavelength, so-called bonding hand of the material gas is excited into vibrating state, and chemical reaction thereof is facilitated.

In case where the wavelength of the irradiating light is selected $\lambda < 350$ nm, the reaction gas is brought mainly into electron-exciting state so that light decomposition and hence the gas-phase reaction easily occur. On the other hand, when the wavelength of the light is selected to be longer than 1000 nm, exciting the bonding hand of the reaction gas into vibrating state is usually impossible.

In forming a refractory metal film, the irradiation of light having a wavelength in a range of 400 to 1000 nm excites the material gas on the irradiated surface into a vibrating excitation state. Thus, the reduction reaction of the gas is promoted for accelerating the growing speed of the refractory metal layer on the desired surface portion, while the creation of chemical seed causing the deposition of the refractory metal on the unwanted surface portion is reduced, thus improving the selectivity of the deposition.

According to the present invention, a high quality thin film can be formed under a low temperature at high speed, and where a refractory metal is deposited in accordance with the selective CVD method of this invention, formation of the metal film can be effected with a high selectivity.

Although the method according to the invention can be executed in either of the normal pressure CVD mode or the reduced pressure CVD mode, the formation of thin film of even thickness and quality which could not be so far realized under a normal pressure, is now be made possible by the present invention.

Furthermore, the advantage of the methods of this invention utilizing light irradiation is particularly significant in the case of forming thin film at a low temperature.

BRIEF DESCRIPTION OF THE DRAWINGS

In the accompanying drawings:

FIGS. 1(a) and 1(b) are diagrams showing the steps of forming a tungsten layer in a contact hole according to a conventional selective CVD method;

FIGS. 3(a) and 3(b) are diagrams showing thin film forming steps according to the first embodiment of this invention;

FIGS. 4(a) and 4(b) are diagrams showing thin film forming steps according to the second embodiment of this invention;

FIG. 5 is a diagram showing thin film forming steps of the third embodiment of this invention;

DESCRIPTION OF THE PREFERRED EMBODIMENTS

Figure 2:
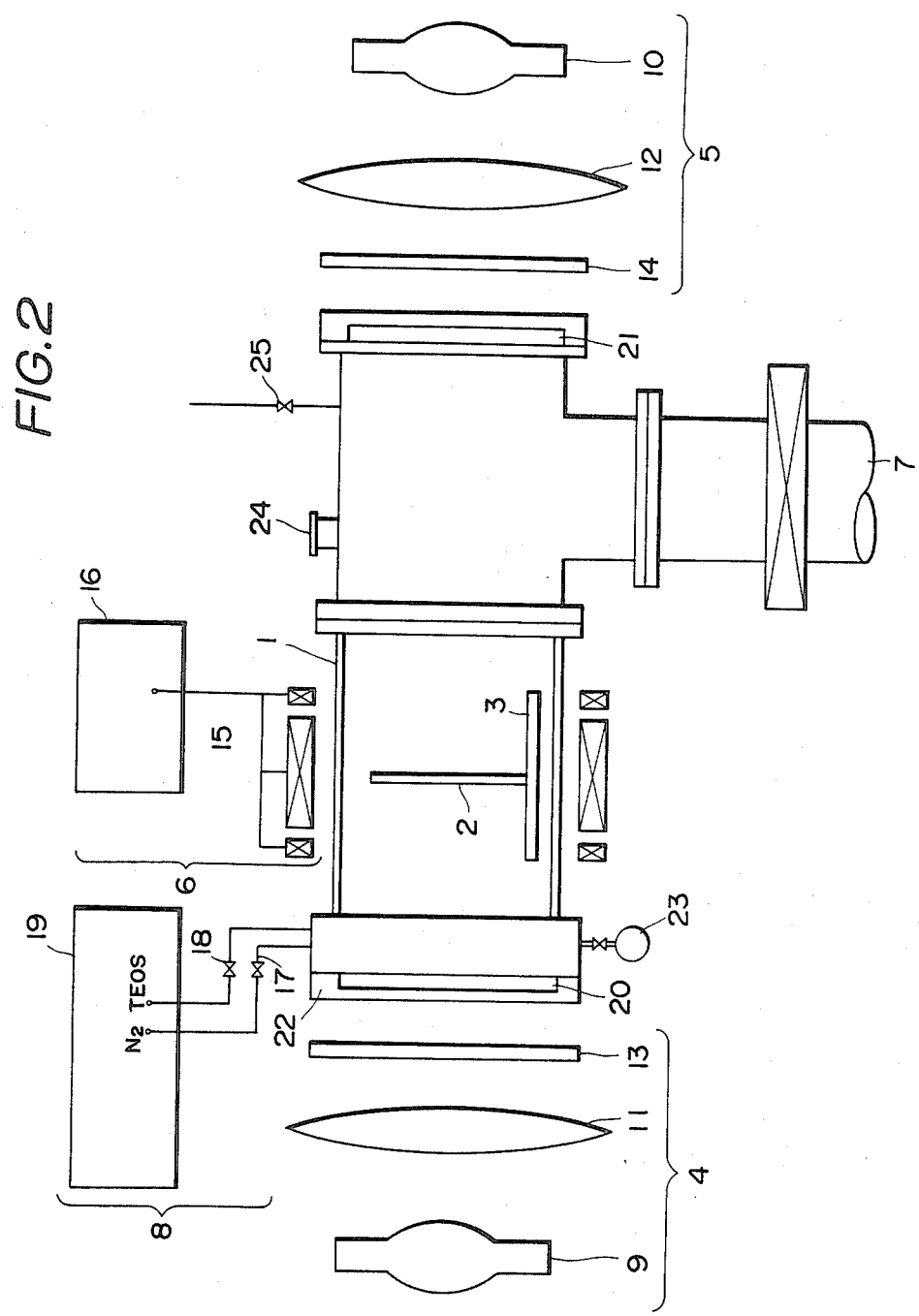
FIG. 2 is a diagram showing a general construction of a chemical vapor deposition device used in the embodiments of the present invention.

Referring to FIG. 2, the device comprises a reaction furnace 1 made of quartz and of 1 m in length and 25 cm in inner diameter, a boat 3 for supporting a substrate 2, on which a thin film is formed in the furnace, first and second optical systems 4 and 5 provided on the outside of the reaction furnace 1 for irradiating both side of the substrate 2 by light, a temperature control system 6 provided for controlling the temperature in the furnace 1 to a desired value, and an exhaust system 7 and a gas supplying system 8. The device operates such that a desired thin film is formed on the substrate 2 according to a chemical vapor deposition method when the substrate 2 is irradiated by light of a predetermined wavelength range.

The first and second optical systems 4 and 5 include first and second light sources 9 and 10 comprising first and second xenon lamps, first and second condensing lenses 11 and 12, and first and second interference filters 13 and 14 for selecting wavelength, respectively. The first and second optical systems 4 and 5 are so constructed that the output wavelength thereof can be selected suitably.

The temperature control system 6 comprises a heater 15 of three-zone system arranged around the reaction furnace 1, and a temperature controller 16, and operates to control the temperature in the furnace 1.

The gas supplying system 8 is connected to the furnace 1 through first and second step valves 17 and 18, and further comprises a gas controller 19 which controls the quantity of TEOS gas and nitrogen gas ($N_2$) supplied to the furnace 1 under the control of the first and second stop valves.

At both ends of the reaction furnace 1, first and second windows made of quartz ground to meet optical specification are secured through O-rings seal, so that the light from the first and second optical systems can pass therethrough into the furnace. The first window is provided on an inlet port 22 which can be opened and closed. Through the inlet port 22, the substrate can be brought into or removed out of the furnace. Reference numerals 23, 24 and 25 designate a pressure meter, leaking automatic valve, and a back-fill gas line, respectively.

A method constituting a first embodiment of the invention forming a silicon dioxide layer by use of the above described CVD device will now be described.

A monocrystalline silicon substrate 2 as shown in FIG. 3(a) which has been subjected to a surface cleaning process is firstly placed on the boat 3, and then brought into the reaction furnace 1 through the inlet port 22. Then the exhaust system 7 is operated to evacuate the interior of the furnace, and the first stop valve 17 is opened for introducing nitrogen gas ($N_2$). When the pressure meter 23 indicates a predetermined value, the heater 15 operates to heat the substrate to a desired temperature range of 300° to 800° C. under the control of the controller 16 which constantly monitors the temperature of the substrate. Then the xenon lamp 9 is ignited, and the light emitted from the lamp 9 and disposed in parallel by the condenser lens 11 is passed through the interference filter 13. The light selected by the filter 13 into a wavelength range of $\lambda = 400$ to 600 nm is irradiated on the surface of the substrate 2.

When the stability of the temperature is confirmed, the second stop valve 18 is opened so as to supply TEOS gas for a predetermined period and to form a silicon dioxide layer 200 on the substrate 2 as shown in FIG. 3(b). After terminating the supply of the TEOS gas, the first xenon lamp 9 is turned off. Upon interrupting the operation of the heater 15, the substrate is cooled down in a nitrogen atmosphere, and removed from the reaction furnace 1.

When the film thus obtained is compared with that obtained without light irradiation, it is found that a thickness of the film 2 to 100 times larger than that formed by the conventional method can be obtained in an equal time period in an equal temperature range of 400° to 800° C. That is, a deposit speed 2 to 200 times faster than that of the conventional method can be realized, and a film of even thickness and quality can be obtained by the present invention.

Furthermore, according to the first embodiment method, the formation of a silicon dioxide film at a low temperature of 400° C., which could not be realized by the conventional reduced-pressure CVD method, is now made possible.

Although in the above description, the light has been irradiated from the front side of the substrate, according to a second embodiment of this invention, only the second xenon lamp 10 is ignited, and the light emitted from the lamp is irradiated from the rear side of the substrate. For instance, as shown in FIG. 4(a), a heat oxidized layer 302 having a contact hole 301 is deposited on a monocrystalline silicon substrate 300, and alike the first embodiment, a light having a wavelength $\lambda = 400-600$ nm is irradiated from the rear side of the substrate 300 as shown in FIG. 4(b) for producing a silicon dioxide layer 303 over the oxide layer 302. At this time, the monocrystalline silicon substrate 300 passes the light of the aforementioned wavelength range, while the heat oxidized layer 302 does not pass the light of this range. As a consequence, the excitation of the reactive gas is executed only in a surface portion of the substrate having the contact hole 301 in the heat oxidized layer 302, thus selectively accelerating the deposition speed of the silicon dioxide layer 303, and hence a surface configuration of substantially flat can be obtained on the surface of the semiconductor device.

In a third embodiment of this invention, the first and second optical systems are both operated so that light having different wavelengths are irradiated from both sides of the substrate. That is, as shown in FIG. 5, a light having a wavelength $\lambda_1$ is irradiated from the front side of the substrate similar to that shown in FIG. 4(a), while another light having a wavelength $\lambda_2$ that cannot pass through the heat oxidized layer is irradiated from the rear side of the same substrate. As a consequence, the silicon dioxide layer is selectively formed in the contact hole at a high speed, and the formation of the silicon dioxide layer for flattening the surface of the semiconductor device is executed in a far shorter time period.

Although in the above described embodiments, the formation of silicon dioxide layer by a TEOS thermal decomposition has been described, it is apparent that the thin film forming method of the present invention may be applied to the formation of other kind of thin film such as the formation of a polycrystalline silicon film by the thermal decomposition of monosilane; formation of a silicon nitride film from monosilane and ammonia; formation of an aluminum film by use of isobutylaluminum, trimetylaluminum, aluminum trichloride, or aluminum tribromide; formalin of aluminum alloy film by use of the same added with silane; formation of a tungsten film and a tungsten silicide film by use of tungsten hexafluoride, tungsten pentachloride, and hydrogen, and by adding silane to such substances; and the formation of molybdenum film, titanium film, molybdenum silicide film, titanium silicide film and the like.

Figure 6A:
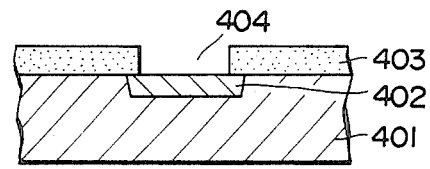
FIGS. 6(a) and 6(b) are diagrams showing steps of forming a tungsten layer in a contact hole according to a selective CVD method constituting the fourth embodiment of this invention.
Figure 6B:
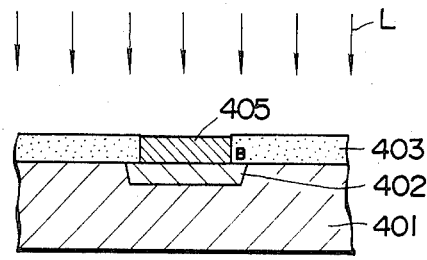

As a fourth embodiment of the invention, a tungsten film is formed selectively on a silicon portion of a layer that covers the substrate and comprises silicon and silicon dioxide portions in a mixed manner as shown in FIGS. 6(a) and 6(b).

According to this embodiment, a substrate 401 made of a P type silicon formed with an operative region consisting of a diffusion layer 402 and covered by a silicon dioxide layer 403 having a contact hole 404 as shown in FIG. 6(a) is firstly placed in the CVD furnace, and heated to a predetermined temperature while hydrogen gas is flowing.

When the temperature is stabilized, light L having a wavelength of 400 to 1000 nm is irradiated from the xenon lamp as shown in FIG. 6(b), while tungsten hexafluoride gas ($WF_6$) is introduced into the furnace, so that a tungsten layer 405 is formed in the contact hole 404. At this time, the partial pressure of the hexafluoride gas is held to 2 m Torr, the partial pressure of the hydrogen is held to 0.02 Torr, and the depositing time is selected to be 80 minutes.

In this manner, the contact hole 404 of approximately 1 μm depth can be buried by the tungsten layer completely without causing deposition of tungsten grains on the silicon dioxide layer 403. As a consequence, no disconnecting portion is provided after the deposition of a connecting layer, and a semiconductor device of high reliability can be thereby obtained. Furthermore, no lateral reaction is caused to the boundary surface B between the silicon and silicon dioxide layers, and hence even in a case where an intermediate layer is formed at an electrode-forming time in source-drain-gate regions. There is no possibility of causing short-circuit trouble and else, and the intermediate layer can be formed with a sufficient selectivity.

Figure 7:
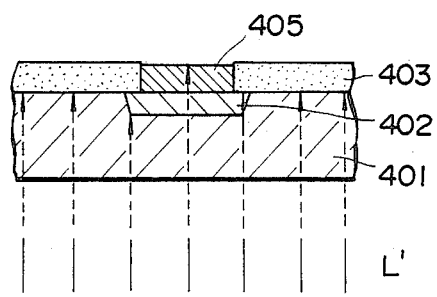
FIGS. 7 and 8 are diagrams showing the seventh and eighth embodiments of this invention.

It is considered that the above described advantageous feature can be obtained due to the fact that the bonding hand of the tungsten hexafluoride is exerted into a vibrating condition, so that the reducing reaction of tungsten is promoted, and the deposition of chemical seeds on the silicon dioxide layer, from which tungsten grains tend to be created, is thereby substantially reduced. Although in the fourth embodiment, the light irradiation has been effected from the front side of the substrate, according to a fifth embodiment shown in FIG. 7, the light may be irradiated from the rear side of the substrate. More specifically, an operative region (or gate region) formed by a diffusion layer 402 is provided in a P type silicon substrate 401, while a contact hole 404 is provided in a silicon dioxide layer 403 formed on the surface of the substrate 401 as in the case of FIG. 6(a). The substrate thus formed is placed in the CVD furnace, and a tungsten layer 405 is selectively formed in the contact hole 404 while light L' having a wavelength in a range of λ=400-600 nm is irradiated from the rear side of the substrate. At this time, although the P type silicon substrate 401 can pass the light L' of a wavelength in a range of 400 to 600 nm, the silicon dioxide layer 403 cannot pass the light L'. Thus, the excitation of the reaction gas is effected only on the surface of the diffusion layer exposed to outside in the contact hole 404 where no silicon dioxide layer exists, and the deposition speed of the tungsten layer 405 is selectively promoted in the contact hole 404.

Figure 8:
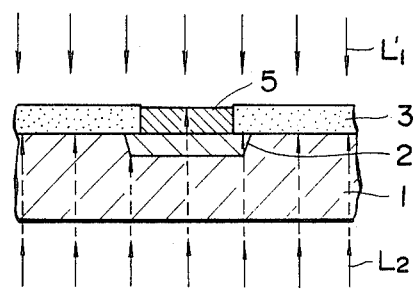

As a sixth embodiment of this invention, it may be so arranged that the substrate is irradiated from the front side and the rear side simultaneously by lights having different wavelengths as shown in FIG. 8.

More specifically, a substrate 501 which is formed as in the case of FIG. 6(a), is irradiated from the front side thereof by a light $L_1$ for preventing the deposition of chemical seeds, causing the generation of tungsten grains, onto the surface of a silicon dioxide layer 503, while it is irradiated from the rear side by a light $L_2$ having a wavelength penetrating the P type silicon substrate 501 but not penetrating the silicon dioxide layer 503. Thus, the light excitation of the reaction gas occurs only on the surface of a diffusion layer exposed in the contact hole 504, where no silicon dioxide layer 503 exists, and as a consequence, the deposition speed of tungsten is accelerated and a tungsten layer 505 is formed selectively at a high speed.

The method of this invention may otherwise be applied to the formation of a pattern of a refractory metal such as tungsten on the silicon dioxide layer and the like.

Figure 9A:
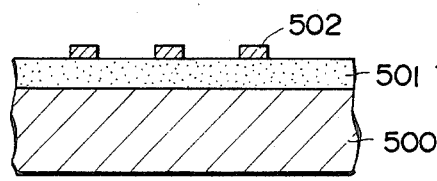
FIGS. 9(a) and 9(b) are diagrams showing steps of forming a wiring pattern constituting the nineth embodiment of this invention.

In such an application constituting a seventh embodiment of this invention, a silicon dioxide layer 501 is formed on a silicon substrate 500 formed with a desired operative region (not shown) and a polysilicon layer of a approximately 1000 A thickness is formed on the silicon dioxide layer 501 in accordance with a chemical vapor deposition method and the like. The polysilicon layer is then formed into a polysilicon pattern 502 of, for instance, a line-shape by use of a photolithoetching method, as shown in FIG. 9(a).

Figure 9B:
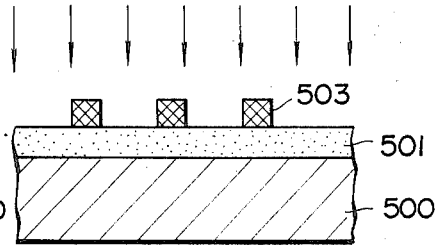

The silicon substrate 500 thus provided with the polysilicon pattern 502 is irradiated as shown in FIG. 9(b) from the front side of the substrate by light having a wavelength λ=400 to 1000 μm for executing a CVD method. In this manner, a tungsten pattern 503 memorizing the polysilicon pattern 502 and adapted for a connecting use can be formed on the surface of the silicon dioxide layer 501. Herein, polysilicon is consumed in accordance with the hereinbefore described reaction formula (1), and hence a connection pattern made of pure tungsten can be obtained by adjusting the deposition temperature.

Since light transmits in a linear manner, only the upper portion of the polysilicon pattern 502 receives the light irradiating the front side of the substrate, and tungsten selectively grows upwardly. Accordingly, there is no fear of increasing the width of the pattern, and a tungsten pattern 503 following the polysilicon pattern 502 faithfully can be thereby produced.

According to this method, resistance reduction of the polysilicon connection can be achieved, and a high precision tungsten pattern can be realized at a high productivity.

Although in the above described embodiment, a method reducing tungsten hexafluoride by hydrogen or silicon has been described, a tungsten halide such as tungsten chloride may otherwise be used as the reaction gas. Furthermore, instead of tungsten used in the embodiment, various high melting point metal such as titanium (Ti), tantalum (Ta), molybdenum (Mo) and the like may otherwise be used. As for the under layer substance imparting the selectivity, not only the combination at silicon and silicon dioxide, but also the combinations of aluminum, aluminum-silicon alloy, titanium silicide (Ti $Si_2$), molybdenum silicide (Mo $Si_2$), and silicon dioxide, silicon nitride ($Si_3N_4$) may be used effectively.

What is claimed is:

1. A method for producing a semiconductor device comprising the steps of preparing a semiconductor substrate, partially covering said semiconductor substrate with an insulating layer, contacting the semiconductor substrate with a reactive gas and selectively forming a thin film on a surface of the substrate by selective chemical vapor deposition, including irradiating a light beam of a 400–1000 nm wavelength onto an entire surface of the substrate to activate the reactive gas near a portion of the surface of the substrate and heating the substrate to a temperature of 300° to 800° C.

2. A method according to claim 1, wherein formation of said thin film is effected by depositing a refractory metal onto said substrate surface to form said insulating layer, said irradiating light is directed against a rear side of the substrate opposite said insulating layer, and the wavelength of said light is selected to penetrate the substrate, while not penetrating said insulating layer.

3. A method according to claim 1 wherein said irradiating light is directed against a front side of the substrate surface.

4. A method according to claim 1 wherein said irradiating light is directed against a rear side and a front side of the substrate surface, with said light being of different wavelengths at each side.

5. A method according to claim 1 wherein said thin film is of a refractory metal selected from the group consisting of tungsten and molybdenum.

6. A method according to claim 1 wherein said thin film is formed on a stepped surface of said substrate, and said irradiating light is directed against a rear side of the substrate opposite said insulating layer, and said thin film is thereby formed selectively in a recessed portion of the stepped surface of the substrate.

7. A method according to claim 6 wherein said irradiating light is additionally directed against a front side of the substrate.

8. A method according to claim 2, wherein formation of said thin film is effected by depositing tungsten by using a mixed gas comprising tungsten hexafluoride and hydrogen as said reactive gas.

* * * * *